(12) United States Patent
Noda

(10) Patent No.: US 8,110,897 B2
(45) Date of Patent: Feb. 7, 2012

(54) SEMICONDUCTOR DEVICE WITH CARBON-CONTAINING REGION

(75) Inventor: Taiji Noda, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 12/716,817

(22) Filed: Mar. 3, 2010

(65) Prior Publication Data
US 2010/0164017 A1 Jul. 1, 2010

Related U.S. Application Data

(63) Continuation of application No. 11/183,822, filed on Jul. 19, 2005, now abandoned.

(30) Foreign Application Priority Data

Sep. 27, 2004 (JP) ................................. 2004-279076

(51) Int. Cl.
H01L 21/02 (2006.01)
(52) U.S. Cl. ........ 257/607; 257/327; 257/335; 257/336; 257/344; 257/408; 257/655; 257/E21.056; 257/E21.057; 257/E21.059; 257/E21.443; 257/E29.005; 257/E29.053; 257/E29.105; 257/E29.109
(58) Field of Classification Search .............. 257/327, 257/344, 596, E29.266, 335, 336, 408, 607, 257/655, E21.056, E21.057, E21.059, E21.443, 257/E29.005, E29.053, E29.105, E29.109
See application file for complete search history.

(56) References Cited

U.S. PATENT DOCUMENTS

| 4,597,824 | A | * | 7/1986 | Shinada et al. ............... 438/305 |
| 4,992,840 | A | | 2/1991 | Haddad et al. |
| 6,204,543 | B1 | | 3/2001 | Komuro |
| 6,268,640 | B1 | | 7/2001 | Park et al. |
| 6,303,483 | B1 | * | 10/2001 | Kunikiyo ....................... 438/592 |
| 6,342,440 | B1 | | 1/2002 | Sasada et al. |
| 6,426,279 | B1 | | 7/2002 | Huster et al. |
| 6,492,216 | B1 | | 12/2002 | Yeo et al. |
| 6,507,091 | B1 | | 1/2003 | Skotnicki et al. |

(Continued)

FOREIGN PATENT DOCUMENTS
EP 1 168453 A2 1/2002
(Continued)

OTHER PUBLICATIONS

Yang et al., "High performance self-aligned sub-100 nm metal-oxide semiconductor field-effect transistors using x-ray lithography", Journal of Vacuum Science and Technology 12 (1994) pp. 4051-4054.*

(Continued)

*Primary Examiner* — Jay C Kim
(74) *Attorney, Agent, or Firm* — McDermott Will & Emery LLP

(57) ABSTRACT

The semiconductor device of the present invention includes: a gate insulating film formed on a semiconductor region of a first conductivity type; a gate electrode formed on the gate insulating film; and a channel doped layer of the first conductivity type formed in the semiconductor region beneath the gate electrode. The channel doped layer contains carbon as an impurity.

8 Claims, 13 Drawing Sheets

U.S. PATENT DOCUMENTS

| | | | |
|---|---|---|---|
| 2002/0033511 | A1 | 3/2002 | Babcock et al. |
| 2002/0043665 | A1 | 4/2002 | OOtsuka et al. |
| 2002/0125502 | A1 | 9/2002 | Baba et al. |
| 2003/0008462 | A1 | 1/2003 | Horiuchi et al. |
| 2003/0075766 | A1 | 4/2003 | Lin et al. |
| 2004/0018702 | A1 | 1/2004 | Ito et al. |
| 2004/0061187 | A1* | 4/2004 | Weber et al. .................. 257/408 |
| 2004/0072394 | A1 | 4/2004 | Noda |
| 2005/0127449 | A1 | 6/2005 | Momiyama |

FOREIGN PATENT DOCUMENTS

| | | |
|---|---|---|
| EP | 1 408 553 A2 | 4/2004 |
| JP | 10-125916 | 5/1998 |
| JP | 11-145475 | 5/1999 |
| JP | 2000-031481 | 1/2000 |
| JP | 2000-068507 | 3/2000 |
| JP | 2001-250943 | 9/2001 |
| JP | 2002-33477 A | 1/2002 |
| JP | 2004-153246 | 5/2004 |
| JP | 2004-165999 | 6/2004 |
| WO | WO 2004/068588 A1 | 8/2004 |

OTHER PUBLICATIONS

European Search Report issued in Corresponding European Patent Application No. 05019440.6-1235 dated on Jun. 6, 2007.

La Magna, Antonio et al. Role of the Indium-Carbon Interaction on in diffusion and activation in Si, Applied Physics Letters, AIP, American Institute of Physics, Sep. 8, 2003, pp. 1956-1958, Melville, NY, USA.

Gennaro, S. et al. "Effects of Carbon Content and Annealing Conditions on Electrical Activation of Indium Implanted Silicon", Ion Implantation Technology, Proceedings of the 14th International Conference on Sep. 22-27, 2002. Sep. 22, 2003, pp. 552-555, Piscataway, NJ, USA.

Boudinov, H, et al. "Enhanced Electrical Activation of Indium Coimplanted with Carbon in a Silicon Substrate", Hournal of Applied Physics, American Institute of Physics, pp. 5909-5911, vol. 86, No. 10, New York, USA.

Ban, Ibrahim, et al, "Suppression of Oxidation-Enhanced Boron Diffusion in silicon by Carbon Implantation and Characterization of MOSFET's with Carbon-Implanted Channels", IEEE Transaction on Electron Devices, IEE Service Center, Sep. 1997, vol. 44, No. 9., Piscataway, NJ, USA.

Takase, M, et al. "Study of Indium Doping Effect on High Performance Sub-Quarter Micron NMOS: Vt Control and Pocket Implantation", Extended Abstracts of the International Conference on Solid State Devices and Materials, Japan Society of Applied Physics, Sep. 1997, Tokyo, Japan.

Japanese Notice of Reasons for Rejection, w/ English translation thereof, issued in Japanese Patent Application No. JP 2005-003673 dated on Sep. 24, 2008.

Japanese Notice of Reasons for Rejection, w/ English translation thereof, issued in Japanese Patent Application No. JP 2005-003673 dated on Dec. 2, 2008.

English translation of Japanese Notice of Reasons for Rejection, Issued in Japanese Patent Application No. 2008-283624, dated Nov. 22, 2011.

\* cited by examiner

SEMICONDUCTOR DEVICE WITH CARBON-CONTAINING REGION

CROSS-REFERENCE TO RELATED APPLICATION

This application is a Continuation of U.S. patent application Ser. No. 11/183,822, filed on Jul. 19, 2005, now abandoned claiming priority of Japanese Patent Application No. 2004-279076 filed on Sep. 27, 2004, the entire contents of each of which are hereby incorporated by reference.

BACKGROUND OF THE INVENTION

The present invention relates to semiconductor devices and methods for fabricating the devices, and more particularly relates to a MIS semiconductor device which can be reduced in size and has a doped layer having a shallow junction depth and a low resistance, and to a method for fabricating the semiconductor device.

As the number of devices included in a semiconductor integrated circuit continues to increase, MIS transistors are required to be further reduced in size. To that end, MIS transistors need to have a channel doped layer having a shallow junction depth and a low resistance (see Japanese Laid-Open Publication No. 2002-33477, for example.)

Hereinafter, with reference to the accompanying figures, it will be described how to fabricate a semiconductor device including a conventional MIS transistor.

FIGS. 13A through 13E indicate process steps for fabricating the conventional semiconductor device.

First, as shown in FIG. 13A, ions of indium (In) as a P-type dopant are implanted into a semiconductor substrate 100 made of P-type silicon, and then ions of boron (B) as a P-type dopant are implanted into the semiconductor substrate 100. Thereafter, a heat treatment is performed, whereby a P-type channel doped layer 103 is formed in the upper portion of the semiconductor substrate 100 by the diffusion of the indium ions, and a P-type well 104 is formed under the P-type channel doped layer 103 by the diffusion of the boron ions.

Next, as shown in FIG. 13B, a gate insulating film 101 made of silicon oxide is selectively formed on the principal surface of the semiconductor substrate 100, and a gate electrode 102 made of polysilicon is selectively formed on the gate insulating film 102.

Subsequently, as shown in FIG. 13C, with the gate electrode 102 used as a mask, arsenic (As) ions are implanted into the semiconductor substrate 100 to form N-type extended implantation layers 106A. Then, with the gate electrode 102 used as a mask, ions of boron (B) as a P-type dopant are implanted into the semiconductor substrate 100, thereby forming P-type pocket implantation layers 107A under the N-type extended implantation layers 106A.

Then, as shown in FIG. 13D, an insulating film made of silicon oxide is deposited on the semiconductor substrate 100 to cover the gate electrode 102. The deposited insulating film is then etched anisotropically, thereby forming sidewalls 108 on both lateral faces of the gate electrode 102.

Next, as shown in FIG. 13E, the gate electrode 102 and the sidewalls 108 used as a mask, ions of arsenic as an N-type dopant are implanted into the semiconductor substrate 100. Thereafter, the semiconductor substrate 100 is heat-treated at a high temperature of about 1050° C. for a short time, thereby forming N-type heavily doped source/drain layers 105 in the semiconductor substrate 100 alongside the respective sidewalls 108. In this process step, N-type extended doped layers 106 are formed in the semiconductor substrate 100 between the N-type heavily doped source/drain layers 105 and the P-type channel doped layer 103 by the diffusion of the arsenic ions contained in the N-type extended implantation layers 106A. Also, P-type pocket doped layers 107 are formed under the N-type extended doped layers 106 by the diffusion of the boron ions contained in the P-type pocket implantation layers 107A.

As described above, in order to reduce the size of the transistor without causing short channel effects to be exhibited, the conventional semiconductor-device fabrication method tends to use indium-ion implantation in forming the P-type channel doped layer 103 so as to obtain a channel structure having steep concentration profiles.

SUMMARY OF THE INVENTION

However, in the conventional semiconductor-device fabrication method, if indium ions are used as a dopant for forming doped layers such as the P-type channel doped layer 103 or the P-type pocket doped layers 107, a problem occurs in that the activation rate of the indium ions is low and hence sufficient activation concentration cannot be obtained.

If the implantation dose of the indium ions is increased in order to raise the activation concentration of the indium ions, the ion-implanted regions in the semiconductor substrate 100 easily become amorphous, because indium atoms have a high mass number. As a result, transient enhanced diffusion (hereinafter simply referred to as "TED") occurs, which also produces a problem in that abnormal diffusion of the indium is caused during the TED. Note that TED is an enhanced abnormal diffusion phenomenon, which is caused by interaction between excess point defects existing in the silicon substrate, such as interstitial silicon, vacancies, etc., and dopant atoms. In many cases, those excess point defects are introduced due mainly to implantation damages resulting from ion implantation. Therefore, even if indium ions having a relatively high mass number are implanted in order to obtain a shallower and steeper doped layer, the activation of the implanted indium ions serving as the dopant will be insufficient.

Therefore, with the conventional semiconductor-device fabrication method, it is difficult to form a shallow steep channel doped layer, which is required to reduce the transistor size, in such a manner that the channel doped layer has a sufficient activation concentration.

To address the problems described above, it is therefore an object of the present invention to form a channel doped layer having steep dopant-concentration profiles having a shallow junction, thereby suppressing short channel effects, and also to enable the channel doped layer to be formed having a sufficient activation concentration and a low resistance, thereby realizing a miniaturized device capable of maintaining large driving force.

In order to achieve the above object, according to the present invention, carbon is added to a channel doped layer or pocket doped layers in a semiconductor device so as to increase the activation concentration of the dopant introduced into the channel doped layer or the pocket doped layers.

Specifically, a first inventive semiconductor device includes: a gate insulating film formed on a semiconductor region of a first conductivity type; a gate electrode formed on the gate insulating film; and a channel doped layer of the first conductivity type, containing carbon as an impurity and formed in the semiconductor region beneath the gate electrode.

In the first inventive semiconductor device, the carbon added to the channel doped layer suppresses transient enhanced diffusion of a dopant in the channel doped layer, while increasing the activation rate of the introduced dopant. Thus, steep dopant-concentration profiles having a shallow junction, which are necessary to reduce the device size, are realized in the channel doped layer, while the sufficiently increased activation concentration permits the channel doped layer to have a low resistance, thereby allowing the semiconductor device to maintain a large driving force.

The first inventive device preferably further includes: sidewalls formed on lateral faces of the gate electrode, and source/drain doped layers of a second conductivity type formed in the semiconductor region alongside the respective sidewalls. The source/drain doped layers preferably do not contain the carbon. Then, the carbon is contained only in the region where the addition of the carbon is necessary, thereby preventing the semiconductor device from being contaminated by the carbon.

In this case, the source/drain doped layers are preferably formed spaced from the channel doped layer.

The inventive first device preferably further includes extended doped layers of a second conductivity type formed in the semiconductor region below the sides of the gate electrode.

In this case, the first inventive device preferably further includes pocket doped layers of the first conductivity type formed in the semiconductor region under and in contact with the extended doped layers.

In the first inventive device, dopant ions introduced into the channel doped layer are preferably heavy ions having a relatively high mass number.

In this case, the heavy ions are preferably indium ions.

A second inventive semiconductor device includes: a gate insulating film formed on a semiconductor region of a first conductivity type; a gate electrode formed on the gate insulating film; extended doped layers of a second conductivity type formed in the semiconductor region below the sides of the gate electrode; and pocket doped layers of the first conductivity type, containing carbon as an impurity and formed in the semiconductor region under and in contact with the extended doped layers.

In the second inventive semiconductor device, the carbon added to the pocket doped layers formed below the sides of the gate electrode suppresses transient enhanced diffusion of a dopant in the pocket doped layers, while increasing the activation rate of the introduced dopant. Thus, steep dopant-concentration profiles having a shallow junction, which are necessary to reduce the device size, are realized in the pocket doped layers, while the sufficiently increased activation concentration in the pocket doped layers suppresses depletion in the channel doped layer, thereby making it possible to suppress short channel effects.

The second inventive device preferably further includes: sidewalls formed on lateral faces of the gate electrode, and source/drain doped layers of the second conductivity type formed in the semiconductor region alongside the respective sidewalls. In the source/drain doped layers, regions away from the pocket doped layers preferably do not contain the carbon. Then, the carbon is contained only in the regions where the addition of the carbon is necessary, thereby preventing the semiconductor device from being contaminated by the carbon.

In the second inventive device, dopant ions introduced into the pocket doped layers are preferably heavy ions having a relatively high mass number.

In this case, the heavy ions are preferably indium ions.

In the first or second inventive device, the semiconductor region is preferably made of silicon.

A first inventive method for fabricating a semiconductor device includes the steps of: (a) implanting first dopant ions of a first conductivity type into a semiconductor region of the first conductivity type, thereby forming a channel implantation layer; (b) selectively implanting second dopant ions, which are made of carbon or made of molecules containing carbon, into a channel formation region in the semiconductor region, thereby forming a carbon implantation layer in the channel implantation layer; (c) subjecting, after the steps (a) and (b), the semiconductor region to a first heat treatment so as to cause diffusion of the first dopant ions from the channel implantation layer and the carbon implantation layer, thereby forming a channel doped layer in the semiconductor region; (d) forming a gate insulating film on the channel doped layer in the semiconductor region; and (e) forming a gate electrode on the gate insulating film, wherein the channel doped layer contains the carbon of the second dopant ions.

According to the first inventive semiconductor device fabrication method, the second dopant ions, made of carbon or made of molecules containing carbon, are selectively implanted into the channel formation region in the semiconductor region to form the carbon implantation layer in the channel implantation layer. Therefore, when the channel doped layer is formed through the later heat treatment, the carbon implanted as the impurity into the channel implantation layer suppresses transient enhanced diffusion of the first dopant in the channel doped layer, while increasing the activation rate of the implanted first dopant. As a result, steep dopant-concentration profiles having a shallow junction, which are necessary to reduce the device size, are realized in the channel doped layer, while the sufficiently increased activation concentration permits the channel doped layer to have a low resistance, thereby realizing a miniaturized device capable of maintaining a large driving force.

The first inventive method preferably further includes, between the steps (a) and (b), the step of forming, on the semiconductor region, a mask pattern having an opening that exposes the channel formation region. In the step (b), the second dopant ions are preferably selectively implanted into the channel formation region by using the mask pattern, thereby forming the carbon implantation layer.

The first inventive method preferably further includes, before the step (a), the step of forming, on the semiconductor region, a mask pattern having an opening that exposes the channel formation region. In the step (a), the first dopant ions are preferably selectively implanted into the channel formation region by using the mask pattern, thereby forming the channel implantation layer, and in the step (b), the second dopant ions are preferably selectively implanted into the channel formation region by using the mask pattern, thereby forming the carbon implantation layer.

The first inventive method preferably further includes, after the step (e), the step (f) of forming extended implantation layers by implanting third dopant ions of a second conductivity type into the semiconductor region with the gate electrode used as a mask; and after the step (f), the step (g) of subjecting the semiconductor region to a second heat treatment, thereby forming extended doped layers by diffusion of the third dopant ions from the extended implantation layers.

In this case, the first inventive method preferably further includes, between the steps (e) and (g), the step of implanting fourth dopant ions of the first conductivity type into the semiconductor region with the gate electrode used as a mask, thereby forming pocket implantation layers. In the step (g), the second heat treatment preferably causes diffusion of the fourth dopant ions from the pocket implantation layers, thereby forming pocket doped layers under the extended doped layers.

The first inventive method preferably further includes, after the step (e), the step (h) of forming sidewalls on lateral faces of the gate electrode; after the step (h), the step (i) of implanting fifth dopant ions of a second conductivity type into the semiconductor region with the sidewalls used as a mask, thereby forming source/drain implantation layers; and after the step (i), the step (j) of subjecting the semiconductor region to a third heat treatment to cause diffusion of the fifth dopant ions from the source/drain implantation layers, thereby forming source/drain doped layers.

The first inventive method preferably further includes, before the step (a), the steps of: (1) forming a dummy gate electrode on the semiconductor region; (2) forming sidewalls on both lateral faces of the dummy gate electrode; (3) forming, after the step (2), on the semiconductor region, an insulating film from which the upper surface of the dummy gate electrode is exposed; and (4) selectively removing the dummy gate electrode after the step (3), thereby exposing a part of the semiconductor region between the sidewalls. In the step (a), the first dopant ions are preferably implanted into the exposed part of the semiconductor region with the insulating film used as a mask, thereby forming the channel implantation layer; and in the step (b), the second dopant ions are preferably implanted into the exposed part of the semiconductor region with the insulating film used as a mask, thereby forming the carbon implantation layer.

In the first inventive method, the first dopant ions are preferably heavy ions having a relatively high mass number.

In this case, the heavy ions are preferably indium ions.

In the first inventive method, in the step (a), the channel implantation layer preferably does not become amorphous due to the implantation of the first dopant ions.

A second inventive method for fabricating a semiconductor device includes the steps of: (a) forming a gate insulating film on a semiconductor region of a first conductivity type; (b) forming a gate electrode on the gate insulating film; (c) implanting first dopant ions of a second conductivity type into the semiconductor region with the gate electrode used as a mask, thereby forming extended implantation layers; (d) implanting second dopant ions of the first conductivity type into the semiconductor region with the gate electrode used as a mask, thereby forming pocket implantation layers; (e) selectively implanting third dopant ions, which are made of carbon or made of molecules containing carbon, into pocket formation regions in the semiconductor region, thereby forming carbon implantation layers; and (f) subjecting the semiconductor region to a first heat treatment after the steps (c), (d), and (e) have been performed, whereby diffusion of the first dopant ions from the extended implantation layers is caused to form extended doped layers in the semiconductor region below the sides of the gate electrode, and diffusion of the second dopant ions from the pocket implantation layers is caused to form pocket doped layers under the extended doped layers, wherein the pocket doped layers contain the carbon of the third dopant ions.

According to the second inventive semiconductor device fabrication method, the third dopant ions, made of carbon or made of molecules containing carbon, are selectively implanted into the pocket formation regions in the semiconductor region to form the pocket implantation layers. Therefore, when the pocket doped layers are formed through the subsequent heat treatment, the carbon implanted as the impurity into the pocket implantation layers suppresses transient enhanced diffusion of the second dopant in the to channel doped layer, while increasing the activation rate of the implanted second dopant. Thus, steep dopant-concentration profiles having a shallow junction, which are necessary to reduce the device size, are realized in the pocket doped layers, while the sufficiently increased activation concentration in the pocket doped layers suppresses depletion more reliably. As a result, it is possible to suppress short channel effects and hence realize a miniaturized device capable of maintaining a large driving force.

The second inventive method preferably further includes, after the step (f), the step (g) of forming sidewalls on lateral faces of the gate electrode; after the step (g), the step (h) of implanting fourth dopant ions of the second conductivity type into the semiconductor region with the sidewalls used as a mask, thereby forming source/drain implantation layers; and after the step (h), the step (i) of subjecting the semiconductor region to a second heat treatment to cause diffusion of the fourth dopant ions from the source/drain implantation layers, thereby forming source/drain doped layers.

In the second inventive method, the second dopant ions are preferably heavy ions having a relatively high mass number.

In this case, the heavy ions are preferably indium ions.

In the first or second inventive method, the semiconductor region is preferably made of silicon.

DESCRIPTION OF THE PREFERRED EMBODIMENTS

First Embodiment

A first embodiment of the present invention will be described with reference to the accompanying drawings.

Figure 1:
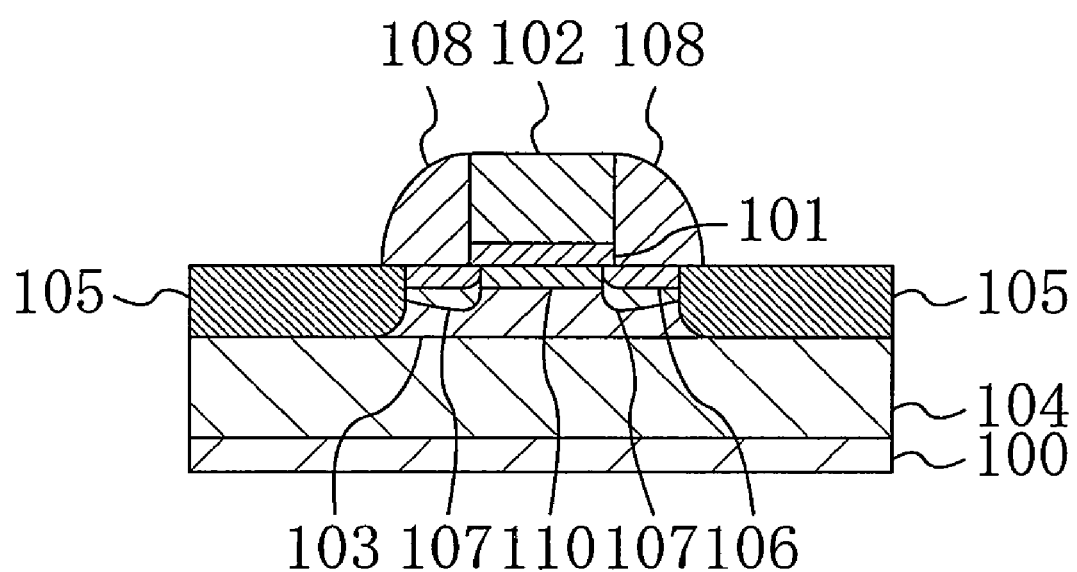
FIG. 1 illustrates a cross sectional structure of a semiconductor device according to a first embodiment of the present invention.

FIG. 1 illustrates a cross-sectional structure of a semiconductor device, a MIS transistor, according to the first embodiment of the present invention. As shown in FIG. 1, the MIS transistor of the first embodiment includes a gate insulating film 101 selectively formed on the principal surface of a semiconductor substrate 100 made of P-type silicon (Si), and a gate electrode 102 formed on the gate insulating film 101. The gate insulating film 101 is made of silicon dioxide ($SiO_2$) and has a thickness of about 1.5 nm, while the gate electrode 102 is made of polysilicon or polymetal and has a thickness of about 150 nm.

Sidewalls 108 made of, e.g., silicon nitride ($SiN_x$, for example, $Si_3N_4$) are formed on the semiconductor substrate 100 on both lateral faces of the gate insulating film 101 and gate electrode 102.

A P-type channel doped layer 103 is formed in the semiconductor substrate 100 under the gate insulating film 101 and the sidewalls 108, while N-type heavily doped source/drain layers 105 are formed in the semiconductor substrate 100 alongside the respective sidewalls 108.

In the P-type channel doped layer 103, N-type extended doped layers 106 are formed under the respective sidewalls 108, and P-type pocket doped layers 107 are formed under the respective N-type extended doped layers 106.

The first embodiment is characterized in that a carbon-containing region 110, in which carbon (C) is selectively introduced, is formed in the P-type channel doped layer 103 under the gate insulating film 101. The carbon introduced in the P-type channel doped layer 103 suppresses transient enhanced diffusion of the P-type dopant in the P-type channel doped layer 103. In addition, in order to increase the activation rate of the introduced P-type dopant, steep dopant-concentration profiles having a shallow junction are realized in the P-type channel doped layer 103, which is necessary to reduce the transistor size. If the activation rate of the P-type dopant is increased, the P-type channel doped layer 103 has a low resistance, which allows the MIS semiconductor device to maintain a large driving force.

Hereinafter, with reference to the accompanying figures, it will be described how to fabricate a semiconductor device having the above structure.

FIGS. 2A through 2D and FIGS. 3A through 3D are cross-sectional views indicating process steps for fabricating a semiconductor device according to the first embodiment of the present invention.

Figure 2A:
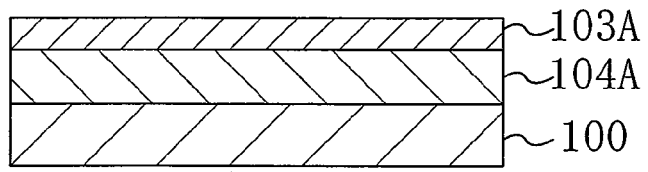
FIGS. 2A through 2D are cross-sectional views indicating process steps for fabricating the semiconductor device of the first embodiment of the present invention.

First, as shown in FIG. 2A, ions of indium (In) as a P-type dopant are implanted into a P-type silicon semiconductor substrate 100 at an implantation energy of about 70 keV and at an implantation dose of about $5 \times 10^{12}$ ions/$cm^2$, thereby forming a P-type channel implantation layer 103A in the upper portion of the semiconductor substrate 100. Thereafter, ions of boron (B) as a P-type dopant are implanted shallowly into the semiconductor substrate 100 under first implantation conditions, i.e., at an implantation energy of about 80 keV and at an implantation dose of about $1 \times 10^{13}$ ions/$cm^2$, and then boron ions are implanted deeply into the semiconductor substrate 100 under second implantation conditions, i.e., at an implantation energy of about 200 keV and at an implantation dose of about $1 \times 10^{13}$ ions/$cm^2$, thereby forming a P-type well implantation layer 104A in the semiconductor substrate 100 under the P-type channel implantation layer 103A. In this manner, when the P-type well implantation layer 104A is formed, the ions are implanted more deeply than the ions implanted for forming the P-type channel implantation layer 103A.

Figure 2B:
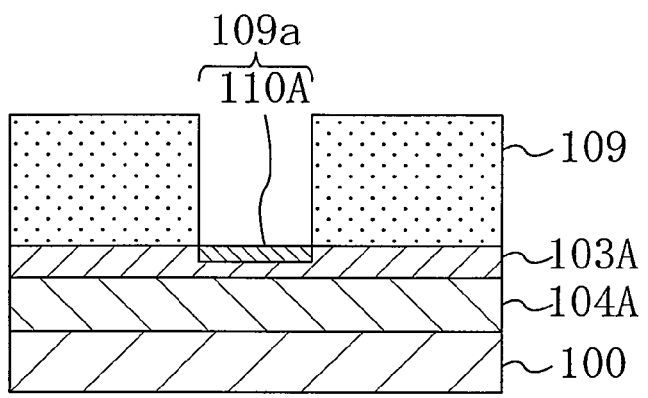

Next, as shown in FIG. 2B, a resist pattern 109 is formed by a lithography process on the semiconductor substrate 100 in which the P-type channel implantation layer 103A and the P-type well implantation layer 104A have been formed. The resist pattern 109 has an opening 109a for exposing a channel formation region of the MIS transistor. In this way, the resist pattern 109 preferably covers the source/drain formation regions of the MIS transistor and has the opening 109a for exposing the channel formation region thereof. Thereafter, with the resist pattern 109 used as a mask, carbon ions are implanted into the channel formation region in the semiconductor substrate 100 at an implantation energy of about 40 keV and at an implantation dose of about $5 \times 10^{14}$ ions/$cm^2$, thereby forming a carbon implantation layer 110A in the upper portion of the channel formation region in the semiconductor substrate 100.

Figure 2C:
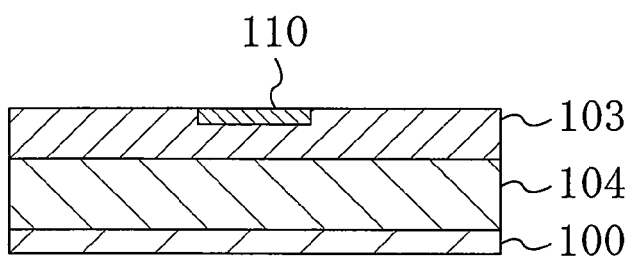

Subsequently, as shown in FIG. 2C, the resist pattern 109 is removed by ashing or the like. Thereafter, a first rapid thermal annealing (RTA) process is performed in which the semiconductor substrate 100 is heated to a temperature between about 850° C. and about 1050° C. at a heating rate of about 100° C./second or more, preferably, at about 200° C./second, and then the peak temperature is either maintained for about ten seconds at longest, or not maintained. As a result of the first rapid thermal annealing process, a P-type channel doped layer 103 and a P-type well 104 are formed in the upper portion of the semiconductor substrate 100 by the diffusion of the indium ions in the P-type channel implantation layer 103A and by the diffusion of the boron ions in the P-type well implantation layer 104A, respectively. The P-type well 104 has a deeper diffusion depth than the P-type channel doped layer 103 and is formed under and in contact with the P-type channel doped layer 103. Furthermore, in an upper portion of the P-type channel doped layer 103, a carbon-containing region 110 is formed shallowly by the diffusion of the carbon ions in the carbon implantation layer 110A. Herein, the rapid thermal annealing process in which the peak temperature is not maintained is an annealing process in which the annealing temperature is decreased at the point in time when the annealing temperature reaches the peak temperature.

Figure 2D:
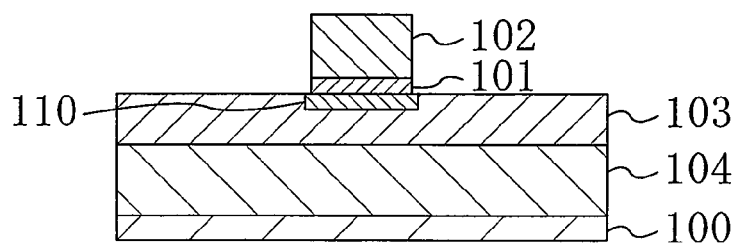

Then, as shown in FIG. 2D, a gate insulating film 101 made of silicon oxide and having a thickness of about 1.5 nm is formed on the principal surface of the semiconductor substrate 100 by a thermal oxidation process, for example. Subsequently, a gate electrode 102 made of polysilicon and having a thickness of about 150 nm is selectively formed on the gate insulating film 101 so as to be located over the carbon-containing region 110. Although a silicon oxide film is used as the gate insulating film 101, the gate insulating film 101 is not limited to this. Alternatively, silicon oxynitride (SiON) may be used, and furthermore, a high dielectric film (a high-k film) made of hafnium oxide ($HfO_x$) or hafnium silicate ($HfSiO_x$), for example, may also be used. Moreover, polysilicon is used for the gate electrode 102 in this embodiment. However, in place of the polysilicon gate, a metal gate made of tungsten (W), tantalum nitride (TaN), etc., may be used, or a fully-silicided (FUSI) gate obtained by full silicidation of metal films such as nickel (Ni) films may also used. Herein, the full silicidation means that all of the metal films formed on the gate insulating film or the like are formed to be silicide films.

Figure 3A:
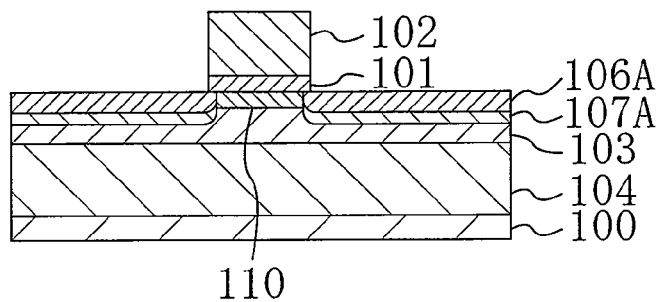
FIGS. 3A through 3D are cross-sectional views indicating process steps for fabricating the semiconductor device of the first embodiment of the present invention.

Then, as shown in FIG. 3A, with the gate electrode 102 used as a mask, ions of arsenic (As) as an N-type dopant are implanted into the semiconductor substrate 100 at an implantation energy of about 1 keV and at an implantation dose of about $1\times10^{15}$ ions/cm$^2$, thereby forming N-type extended implantation layers 106A in the semiconductor substrate 100 outwardly of the carbon-containing region 110. In this ion implantation process, with the gate electrode 102 used as a mask, ions of indium (In) as a P-type dopant are preferably implanted into the semiconductor substrate 100 at an implantation energy of about 100 keV and at an implantation dose of about $4\times10^{13}$ ions/cm$^2$ to form P-type pocket implantation layers 107A under the N-type extended implantation layers 106A. In this process, when the P-type pocket implantation layers 107A are formed, the ions are implanted more deeply than the ions implanted for forming the N-type extended implantation layers 106A.

Figure 3B:
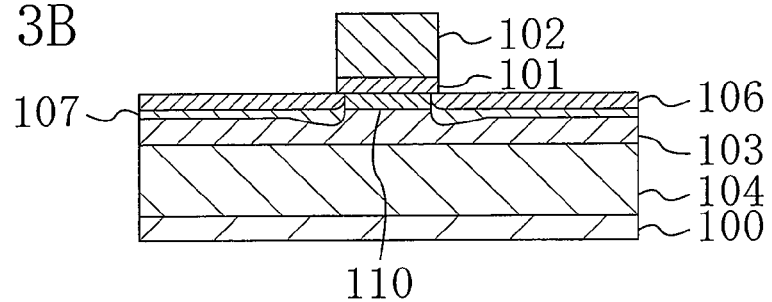

Next, as shown in FIG. 3B, a second rapid thermal annealing process is performed in which the semiconductor substrate 100 is heated to a temperature between about 850° C. and about 1050° C. at a heating rate of about 200° C./second, and then the peak temperature is either maintained for about ten seconds at longest, or not maintained. As a result of the second rapid thermal annealing process, N-type extended doped layers 106 having a relatively shallow junction are formed in the semiconductor substrate 100 to both sides of the gate electrode 102 by the diffusion of the arsenic ions contained in the N-type extended implantation layers 106A. At the same time, under the N-type extended doped layers 106, P-type pocket doped layers 107 are formed in contact with the lower portions of the N-type extended doped layers 106 by the diffusion of the indium ions contained in the P-type pocket implantation layers 107A.

Figure 3C:
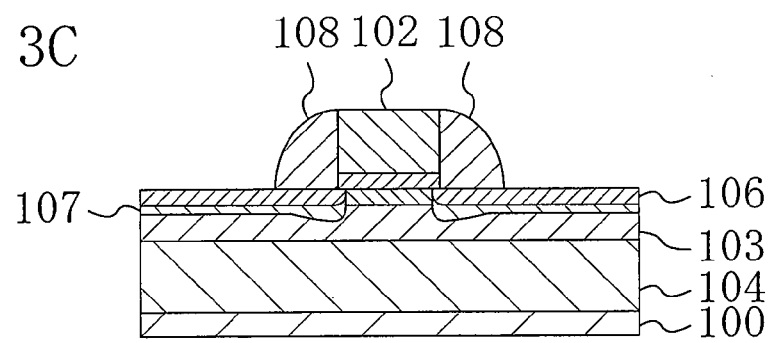

Next, as shown in FIG. 3C, a silicon nitride film having a thickness of about 50 nm is deposited on the entire surface of the semiconductor substrate 100 as well as on the gate electrode 102 by a CVD process, for example. The deposited silicon nitride film is then etched anisotropically using an etching gas whose principal constituent is, e.g., carbon fluoride, thereby forming sidewalls 108 made of silicon nitride on both lateral faces of the gate electrode 102 along the gate-length direction. The material of the sidewalls 108 is not limited to silicon nitride, but silicon oxide, for example, may alternatively be used, or a multilayer film made of silicon oxide and silicon nitride may also be used. In a case of using such a multilayer, a silicon oxide film is preferably formed at least in portions of the sidewalls 108 which are in contact with the principal surface of the semiconductor substrate 100.

Figure 3D:
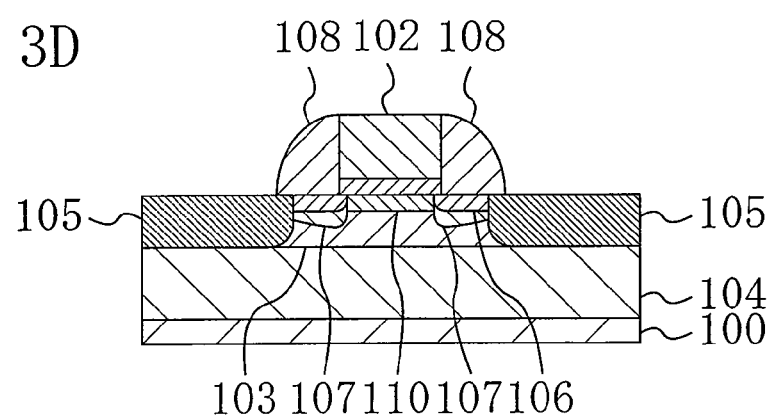

Then, as shown in FIG. 3D, with the gate electrode 102 and the sidewalls 108 used as a mask, ions of arsenic as an N-type dopant are implanted into the semiconductor substrate 100 at an implantation energy of about 10 keV and at an implantation dose of about $3\times10^{15}$ ions/cm$^2$. Subsequently, a third rapid thermal annealing process is performed in which the semiconductor substrate 100 is heated to a temperature between about 850° C. and about 1050° C. at a heating rate between about 200° C./second and about 250° C./second and then the peak temperature is either maintained for about ten seconds at longest, or not maintained. As a result of the third rapid thermal annealing process, N-type heavily doped source/drain layers 105 are formed in the semiconductor substrate 100 alongside the respective sidewalls 108 by the diffusion of the arsenic ions. The N-type heavily doped source/drain layers 105 are connected with the N-type extended doped layers 106 and have a deeper junction than the N-type extended doped layers 106.

As described above, according to the first embodiment, indium ions are implanted into the semiconductor substrate 100 to form the P-type channel implantation layer 103A and then carbon ions are selectively implanted into the channel formation region to form the carbon implantation layer 110A in the process steps shown in FIGS. 2B and 2C. Thereafter, the activation annealing (the first annealing process) for activating the indium ions contained in the P-type channel implantation layer 103A is performed.

In this way, in the first embodiment, after the carbon ions are implanted into the channel formation region in the semiconductor substrate 100, the activation annealing for activating the indium ions contained in the P-type channel implantation layer 103A is performed, whereby the activation rate of the indium ions is increased. Therefore, it is possible to overcome the decrease in the activation of the indium ions caused when the indium ions are used for the P-type channel doped layer 103. In addition, since the carbon ions are selectively implanted into the channel formation region, the carbon is not contained in regions in the semiconductor device where no carbon is necessary, thereby preventing the semiconductor device from being contaminated by the carbon and suppressing junction leakage due to the residual carbon.

Accordingly, it is possible to reliably form the P-type channel doped layer 103 in which a steep shallow junction, a feature of the P-type channel doped layer 103 formed by the indium-ion implantation, is obtained, while a low resistance is achieved by the increased activation of the indium ions.

Second Embodiment

Hereinafter, a second embodiment of the present invention will be described with reference to the accompanying figures.

Figure 4:
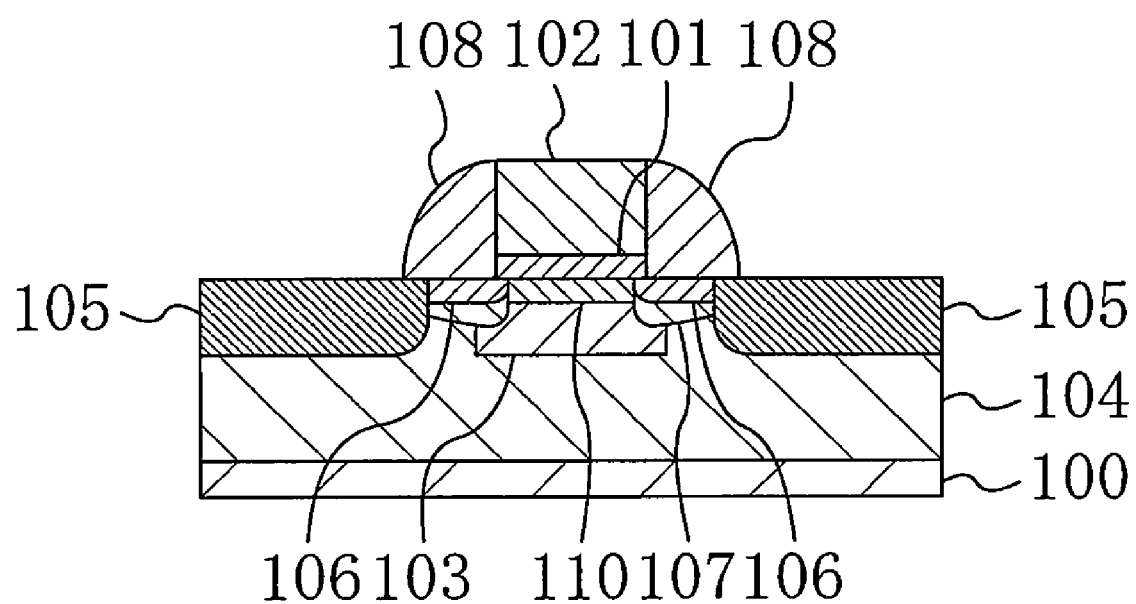
FIG. 4 illustrates a cross sectional structure of a semiconductor device according to a second embodiment of the present invention.

FIG. 4 illustrates a cross sectional structure of a semiconductor device, a MIS transistor, according to the second embodiment of the present invention. In FIG. 4, the same members as those of FIG. 1 are identified by the same reference numerals and the description thereof will be omitted herein.

As shown in FIG. 4, in the MIS transistor of the second embodiment, a P-type channel doped layer 103, which is located in a semiconductor substrate 100 beneath a gate electrode 102, is formed spaced apart from the inner end portions of N-type heavily doped source/drain layers 105.

Hereinafter, with reference to the accompanying figures, it will be described how to fabricate a semiconductor device having the above structure.

FIGS. 5A through 5D and FIGS. 6A through 6D are cross-sectional views indicating process steps for fabricating a semiconductor device according to the second embodiment of the present invention.

Figure 5A:
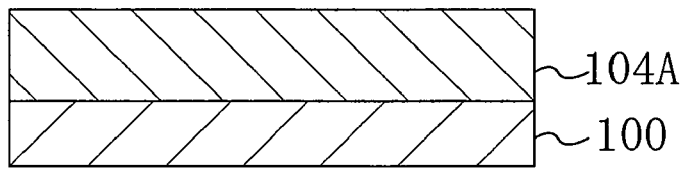
FIGS. 5A through 5D are cross-sectional views indicating process steps for fabricating the semiconductor device of the second embodiment of the present invention.

First, as shown in FIG. 5A, ions of boron (B) as a P-type dopant are implanted shallowly into a P-type silicon semiconductor substrate 100 under first implantation conditions, i.e., at an implantation energy of about 80 keV and at an implantation dose of about $1\times10^{13}$ ions/cm$^2$, and then boron ions are implanted deeply under second implantation conditions, i.e., at an implantation energy of about 200 keV and at an implantation dose of about $1\times10^{13}$ ions/cm$^2$, thereby forming a P-type well implantation layer 104A in the upper portion of the semiconductor substrate 100.

Figure 5B:
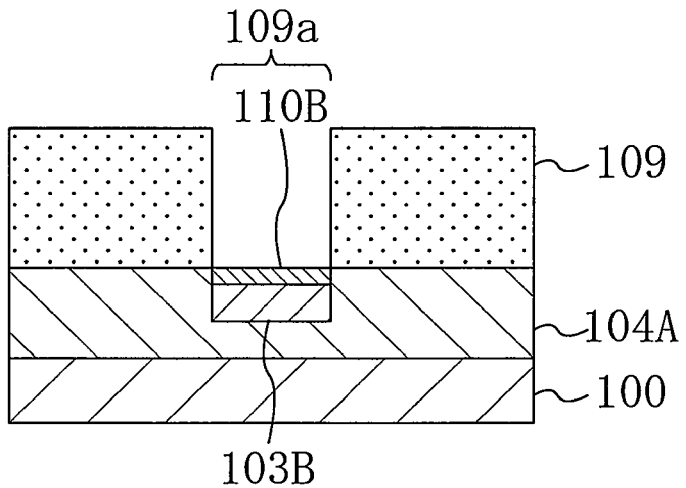

Next, as shown in FIG. 5B, a resist pattern 109 is formed by a lithography process on the semiconductor substrate 100 in which the P-type well implantation layer 104A has been formed. The resist pattern 109 has an opening 109a for exposing a channel formation region of the MIS transistor. In this way, the resist pattern 109 preferably covers the source/drain formation regions of the MIS transistor and has the opening 109a for exposing the channel formation region thereof. Thereafter, with the resist pattern 109 used as a mask, ions of indium (In) as a P-type dopant are implanted into the channel formation region in the semiconductor substrate 100 at an implantation energy of about 70 keV and at an implantation dose of about $5 \times 10^{12}$ ions/cm$^2$, thereby forming a P-type channel implantation layer 103B. Subsequently, with the resist pattern 109 used as a mask, carbon ions are implanted at an implantation energy of about 40 keV and at an implantation dose of about $5 \times 10^{14}$ ions/cm$^2$, thereby forming a carbon implantation layer 110B in the upper portion of the P-type channel implantation layer 103B. In this manner, when the carbon implantation layer 110B is formed, the ions are implanted more shallowly than the ions implanted for forming the P-type channel implantation layer 103B. In addition, in these ion implantation process steps, the indium ions and the carbon ions are implanted at such doses that do not cause formation of an amorphous layer in the semiconductor substrate 100.

Figure 5C:
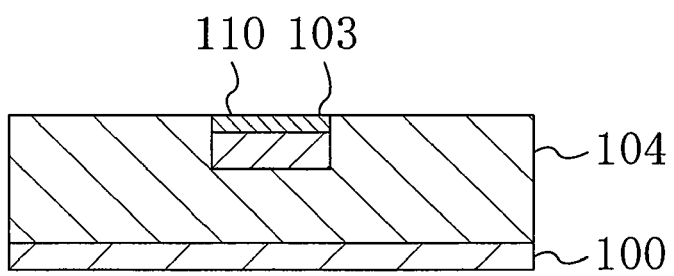

Subsequently, as shown in FIG. 5C, the resist pattern 109 is removed, and then a first rapid thermal annealing (RTA) process is performed in which the semiconductor substrate 100 is heated to a temperature between about 850° C. and about 1050° C. at a heating rate of about 100° C./second or more, preferably, at about 200° C./second, and then the peak temperature is either maintained for about ten seconds at longest, or not maintained.

In the second embodiment, the series of process steps, consisting of the indium-ion and carbon-ion implantation steps shown in FIG. 5B and the first rapid thermal annealing process shown in FIG. 5C, is repeated until the P-type channel doped layer 103 has the desired dopant concentration. For example, in the case of repeating this series of steps twice, the P-type channel doped layer 103 is obtained in such a manner that the implantation dose in each of the indium-ion and carbon-ion implantation steps does not cause formation of an amorphous layer in the semiconductor substrate 100 and that the total indium-ion dose used in the two indium-ion implantation steps allows the p-type channel doped layer 103 to have the desired dopant concentration. As a result, after the series of steps is repeated multiple times, the P-type channel doped layer 103 and the P-type well 104 are formed in the upper portion of the semiconductor substrate 100. More specifically, the P-type channel doped layer 103 is formed by the diffusion of the ions implanted multiple times into the P-type channel implantation layer 103B, while the P-type well 104 is formed by the diffusion of the ions contained in the P-type well implantation layer 104A. In this embodiment, the P-type well 104 is formed having a deeper diffusion depth than the P-type channel doped layer 103 and covering the lateral and lower portions of the P-type channel doped layer 103. In the channel formation region, a carbon-containing region 110 is formed shallowly in the upper portion of the P-type channel doped layer 103, from the carbon implantation layer 110B obtained by the multiple ion implantations.

Figure 5D:
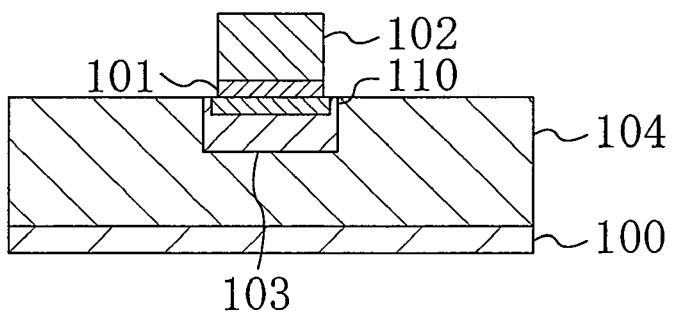

Next, as shown in FIG. 5D, a gate insulating film 101 made of silicon oxide and having a thickness of about 1.5 nm is formed on the principal surface of the semiconductor substrate 100, and then a gate electrode 102 made of polysilicon, polymetal, or the like and having a thickness of about 150 nm is selectively formed on the gate insulating film 101 so as to be located over the carbon-containing region 110.

Figure 6A:
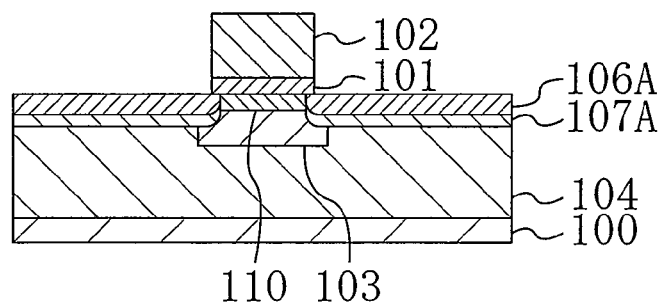
FIGS. 6A through 6D are cross-sectional views indicating process steps for fabricating the semiconductor device of the second embodiment of the present invention.

Subsequently, as shown in FIG. 6A, with the gate electrode 102 used as a mask, ions of arsenic (As) as an N-type dopant are implanted into the semiconductor substrate 100 at an implantation energy of about 1 keV and at an implantation dose of about $2 \times 10^{14}$ ions/cm$^2$ to form N-type extended implantation layers 106A in the semiconductor substrate 100 outwardly of the carbon-containing region 110. In this ion implantation step, P-type pocket implantation layers 107A are preferably formed under the N-type extended implantation layers 106A by implanting, with the gate electrode 102 used as a mask, ions of indium (In) as a P-type dopant into the semiconductor substrate 100 at an implantation energy of about 100 keV and at an implantation dose of about $4 \times 10^{13}$ ions/cm$^2$. In this step, when the P-type pocket implantation layers 107A are formed, the ions are implanted more deeply than the ions implanted for forming the N-type extended implantation layers 106A.

Figure 6B:
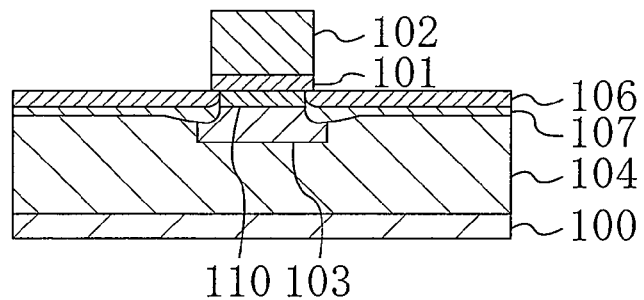

Subsequently, as shown in FIG. 6B, a second rapid thermal annealing process is performed in which the semiconductor substrate 100 is heated to a temperature between about 850° C. to about 1050° C. at a heating rate of about 200° C./second and then the peak temperature is either maintained for about ten seconds at longest, or not maintained. As a result of the second rapid thermal annealing process, N-type extended doped layers 106 having a relatively shallow junction are formed in the semiconductor substrate 100 to both sides of the gate electrode 102 by the diffusion of the arsenic ions contained in the N-type extended implantation layers 106A. At the same time, under the N-type extended doped layers 106, P-type pocket doped layers 107 are formed in contact with the lower portions of the N-type extended doped layers 106 by the diffusion of the indium ions contained in the P-type pocket implantation layers 107A.

Figure 6C:
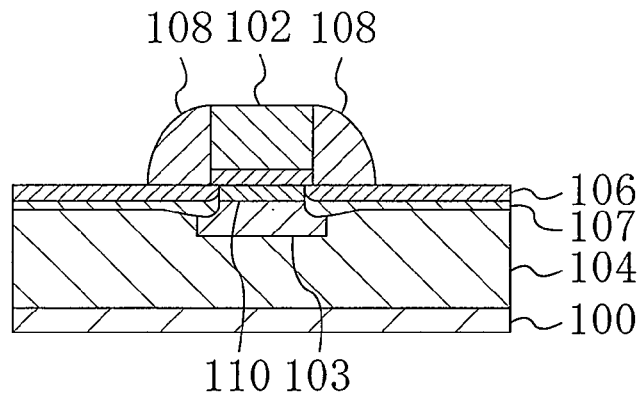

Next, as shown in FIG. 6C, a silicon nitride film having a thickness of about 50 nm is deposited by a CVD process, for example, on the entire surface of the semiconductor substrate 100 as well as on the gate electrode 102. The deposited silicon nitride film is then etched anisotropically, thereby forming sidewalls 108 made of silicon nitride on both lateral faces of the gate electrode 102 along the gate-length direction.

Figure 6D:
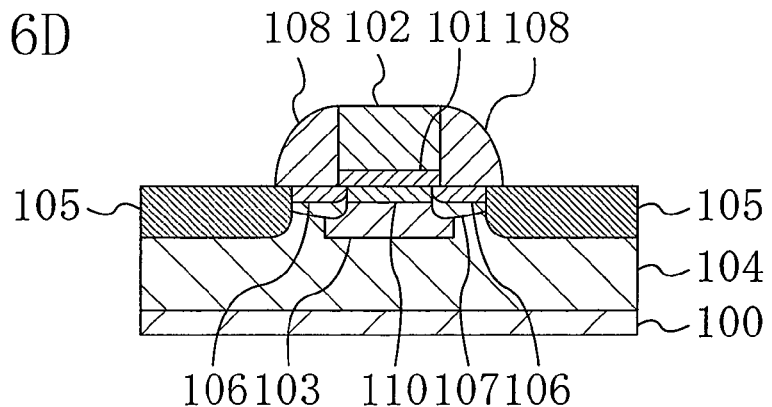

Next, as shown in FIG. 6D, with the gate electrode 102 and the sidewalls 108 used as a mask, ions of arsenic as an N-type dopant are implanted into the semiconductor substrate 100 at an implantation energy of about 10 keV and at an implantation dose of about $3 \times 10^{15}$ ions/cm$^2$. Subsequently, a third rapid thermal annealing process is performed in which the semiconductor substrate 100 is heated to a temperature between about 850° C. and about 1050° C. at a heating rate between about 200° C./second and about 250° C./second and then the peak temperature is either maintained for about ten seconds at longest, or not maintained. As a result of the third rapid thermal annealing process, N-type heavily doped source/drain layers 105 are formed in the semiconductor substrate 100 alongside the respective sidewalls 108 by the diffusion of the arsenic ions. The N-type heavily doped source/drain layers 105 are connected with the N-type extended doped layers 106 and have a deeper junction than the N-type extended doped layers 106.

As described above, according to the second embodiment, in the process steps shown in FIGS. 5B and 5C, indium ions are selectively implanted into the channel formation region in the semiconductor substrate 100 to form the P-type channel implantation layer 103B, and then carbon ions are selectively implanted into the upper portion of the P-type channel implantation layer 103B to form the carbon implantation layer 110B. Thereafter, the activation annealing (the first rapid thermal annealing) for activating the indium ions contained in the P-type channel implantation layer 103B is performed.

In this way, in the second embodiment, after the carbon ions are implanted into the channel formation region, the activation annealing for activating the indium ions contained in the P-type channel implantation layer 103B is performed, whereby the activation rate of to the indium ions is increased. Therefore, it is possible to overcome the decrease in the activation rate of the indium ions caused when the indium ions are used for the P-type channel doped layer 103. In addition, since the carbon ions are selectively implanted into the channel formation region, the carbon is not contained in regions in the semiconductor device where no carbon is necessary, thereby preventing the semiconductor device from being contaminated by the carbon and suppressing junction leakage due to the residual carbon.

Moreover, in the second embodiment, the indium ions and the carbon ions are each implanted in several times so that they are implanted at such doses that do not cause the semiconductor substrate 100 to be amorphized, while the first rapid thermal annealing process is performed for each ion implantation so as to activate the indium ions and restore the crystallinity of the semiconductor substrate 100. Therefore, the ion implantation processes do not cause the semiconductor substrate 100 to become amorphous, and hence problems occurring due to amorphization can be avoided. For example, the present inventor has found that diffusion of indium ions caused with an amorphous-crystal interface being present produces an abnormal diffusion phenomenon, in which segregation of the indium ions occurs in crystal defect layers formed during an annealing process. Nevertheless, in the second embodiment, since the semiconductor substrate 100 does not become amorphous, it is possible to avoid abnormal indium-ion diffusion, even if the total dose of indium ions is increased by implanting the indium ions multiple times.

In cases where the indium ions and the carbon ions are implanted in multiple times, rotation implantation, in which the angle of ion implantation, e.g., the twist angle, is changed for each implantation, may be performed. Also, if the total indium-ion implantation dose is sufficiently smaller than the dose that will cause amorphization, only the carbon ions may be implanted in multiple times.

Accordingly, if the carbon-ion implantation is performed in such a manner as to satisfy the above conditions, it is possible to reliably form the P-type channel doped layer 103 in which a steep shallow junction, a feature of a P-type doped layer formed by indium-ion implantation, is obtained, while a low resistance is achieved by the increased activation of the indium ions.

Third Embodiment

Hereinafter, a third embodiment of the present invention will be described with reference to the accompanying figures.

Figure 7:
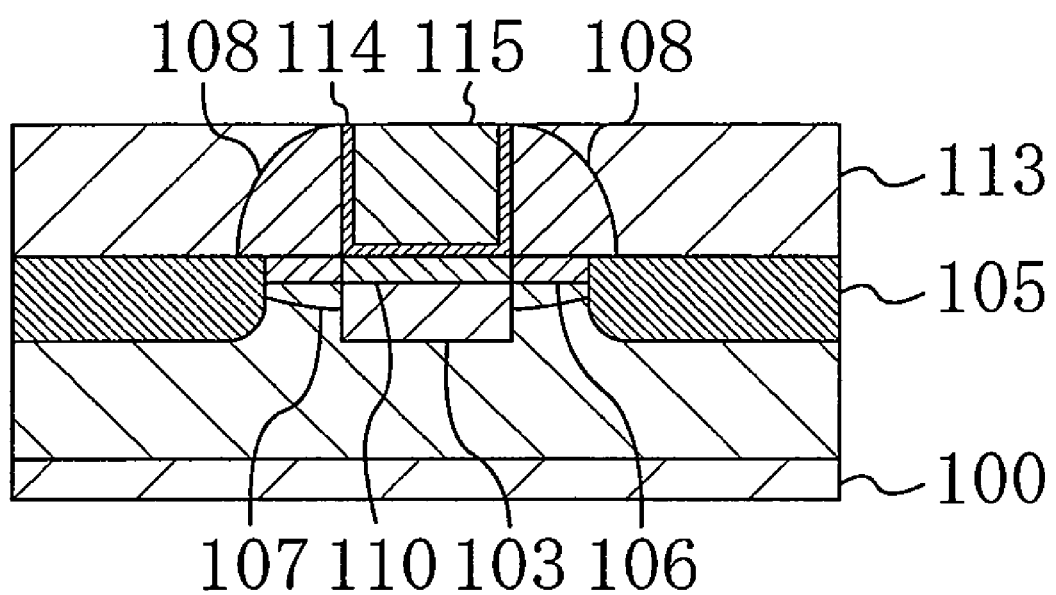
FIG. 7 illustrates a cross sectional structure of a semiconductor device according to a third embodiment of the present invention.

FIG. 7 illustrates a cross sectional structure of a semiconductor device, a MIS transistor, according to the third embodiment of the present invention. In FIG. 7, the same members as those of FIG. 1 are identified by the same reference numerals and the description thereof will be omitted herein.

As shown in FIG. 7, in the MIS transistor of the third embodiment, a gate electrode 115 is made of metal such as tungsten (W) or tantalum nitride (TaN) and a gate insulating film 114 is formed not only on the principal surface of a semiconductor substrate 100 but also between the gate electrode 115 and the inner lateral faces of sidewalls 108.

Hereinafter, with reference to the accompanying figures, it will be described how to fabricate a semiconductor device having the above structure.

FIGS. 8A through 8D and FIGS. 9A through 9E are cross-sectional views indicating process steps for fabricating a semiconductor device according to the third embodiment of the present invention.

Figure 8A:
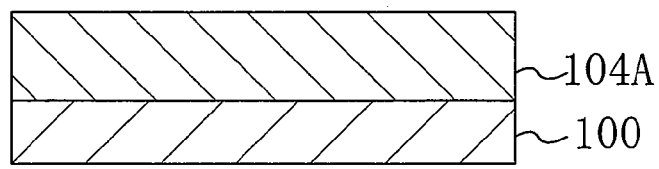
FIGS. 8A through 8D are cross-sectional views indicating process steps for fabricating the semiconductor device of the third embodiment of the present invention.

First, as shown in FIG. 8A, ions of boron (B) as a P-type dopant are implanted shallowly into a P-type silicon semiconductor substrate 100 under first implantation conditions, i.e., at an implantation energy of about 80 keV and at an implantation dose of about $1 \times 10^{13}$ ions/cm$^2$, and then boron ions are implanted deeply under second implantation conditions, i.e., at an implantation energy of about 200 keV and at an implantation dose of about $1 \times 10^{13}$ ions/cm$^2$, thereby forming a P-type well implantation layer 104A in the upper portion of the semiconductor substrate 100.

Figure 8B:
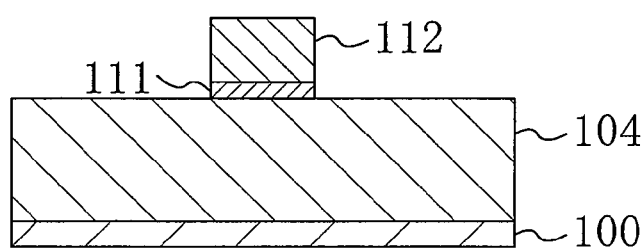

Next, as shown in FIG. 8B, a first rapid thermal annealing (RTA) process is performed in which the semiconductor substrate 100 with the P-type well implantation layer 104A formed therein is heated to a temperature between about 850° C. and about 1050° C. at a heating rate of about 100° C./second or more, preferably, at about 200° C./second, and then the peak temperature is either maintained for about ten seconds at longest, or not maintained. As a result of the first rapid thermal annealing process, a P-type well 104 is formed in the upper portion of the semiconductor substrate 100 by the diffusion of the ions in the P-type well implantation layer 104A. Thereafter, an underlying insulating film 111 made of silicon oxide and having a thickness of about 1.5 nm is selectively formed in a channel formation region on the principal surface of the semiconductor substrate 100, and a dummy gate electrode 112 made of polysilicon and having a thickness of about 150 nm is selectively formed on the underlying insulating film 111.

Figure 8C:
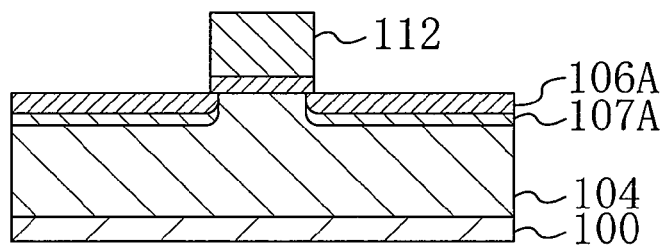

Subsequently, as shown in FIG. 8C, with the dummy gate electrode 112 used as a mask, ions of arsenic (As) as an N-type dopant are implanted into the semiconductor substrate 100 at an implantation energy of about 1 keV and at an implantation dose of about $2 \times 10^{14}$ ions/cm$^2$, thereby forming N-type extended implantation layers 106A in the semiconductor substrate 100 to both sides of the dummy gate electrode 112. In this ion implantation process, with the dummy gate electrode 112 used as a mask, ions of indium (In) as a P-type dopant are preferably implanted into the semiconductor substrate 100 at an implantation energy of about 100 keV and at an implantation dose of about $4 \times 10^{13}$ ions/cm$^2$ to form P-type pocket implantation layers 107A under the N-type extended implantation layers 106A. In this process, when the P-type pocket implantation layers 107A are formed, the ions are implanted more deeply than the ions implanted for forming the N-type extended implantation layers 106A.

Figure 8D:
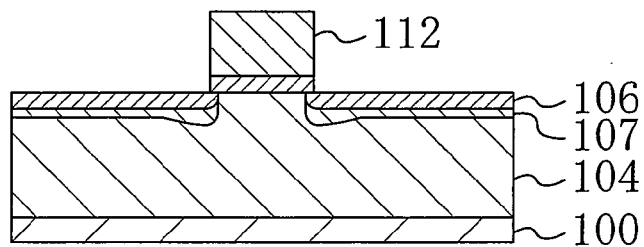

Next, as shown in FIG. 8D, a second rapid thermal annealing process is performed in which the semiconductor substrate 100 is heated to a temperature between about 850° C. and about 1050° C. at a heating rate of about 200° C./second and then the peak temperature is either maintained for about ten seconds at longest, or not maintained. As a result of the second rapid thermal annealing process, N-type extended doped layers 106 having a relatively shallow junction are formed in the semiconductor substrate 100 to both sides of the dummy gate electrode 112 by the diffusion of the arsenic ions contained in the N-type extended implantation layers 106A. At the same time, under the N-type extended doped layers 106, P-type pocket doped layers 107 are formed in contact with the lower portions of the N-type extended doped layers 106 by the diffusion of the indium ions contained in the P-type pocket implantation layers 107A.

Figure 9A:
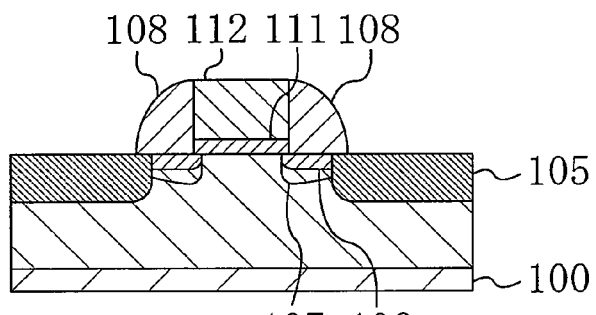
FIGS. 9A through 9E are cross-sectional views indicating process steps for fabricating the semiconductor device of the third embodiment of the present invention.

Next, as shown in FIG. 9A, a silicon nitride film having a thickness of about 50 nm is deposited on the entire surface of the semiconductor substrate 100 as well as on the dummy gate electrode 112 by a CVD process, for example. The deposited silicon nitride film is then etched anisotropically, thereby forming sidewalls 108 made of silicon nitride on both lateral faces of the dummy gate electrode 112 along the gate-length direction. Thereafter, with the dummy gate electrode 112 and the sidewalls 108 used as a mask, ions of arsenic as an N-type dopant are implanted into the semiconductor substrate 100 at an implantation energy of about 10 keV and at an implantation dose of about $3\times10^{15}$ ions/cm$^2$. Subsequently, a third rapid thermal annealing process is performed in which the semiconductor substrate 100 is heated to a temperature between about 850° C. and about 1050° C. at a heating rate between about 200° C./second and about 250° C./second and then the peak temperature is either maintained for about ten seconds at longest, or not maintained. As a result of the third rapid thermal annealing process, N-type heavily doped source/drain layers 105 are formed in the semiconductor substrate 100 alongside the respective sidewalls 108 by the diffusion of the arsenic ions. The N-type heavily doped source/drain layers 105 are connected with the N-type extended doped layers 106 and have a deeper junction than the N-type extended doped layers 106.

Figure 9B:
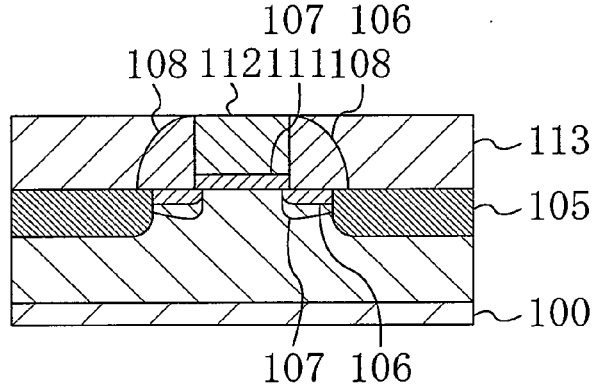

Next, as shown in FIG. 9B, a silicon oxide film having a thickness of from about 150 nm to 200 nm is deposited on the entire surface of the semiconductor substrate 100 as well as on the dummy gate electrode 112 and the sidewalls 108 by a CVD process, for example. Thereafter, the entire surface of the deposited silicon oxide film is polished by a chemical mechanical polishing (CMP) process until the upper surface of the dummy gate electrode 112 is exposed, thereby forming interlayer dielectric films 113, each having the planarized surface, out of the silicon oxide film.

Figure 9C:
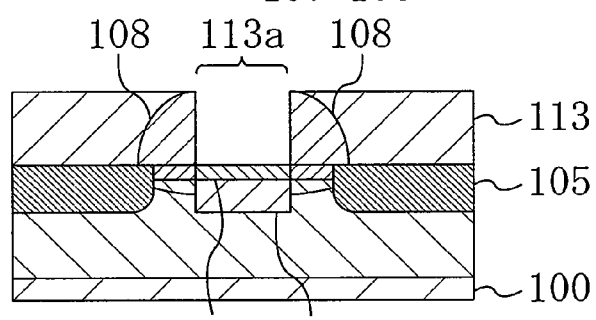

Subsequently, as shown in FIG. 9C, a dry etching process is performed using, e.g., an etching gas containing hydrogen bromide (HBr) or an etching gas in which chlorine (Cl$_2$) and oxygen (O$_2$) are mixed, whereby the dummy gate electrode 112 and the underlying insulating film 111 exposed between the interlayer dielectric films 113 are selectively removed in this order, thereby forming an opening 113a between the interlayer dielectric films 113, i.e., between the sidewalls 108. By this process step, the surface of a gate-electrode formation region on the semiconductor substrate 100 is exposed. Thereafter, with the interlayer dielectric films 113 and the sidewalls 108 used as a mask, ions of indium (In) as a P-type dopant are implanted into a channel formation region in the semiconductor substrate 100 at an implantation energy of about 70 keV and at an implantation dose of about $5\times10^{12}$ ions/cm$^2$, thereby forming a P-type channel implantation layer 103C. Subsequently, carbon ions are implanted from the opening 113a between the sidewalls 108 at an implantation energy of about 40 keV and at an implantation dose of about $5\times10^{14}$ ions/cm$^2$, thereby forming a carbon implantation layer 110C in the upper portion of the P-type channel implantation layer 103C. In this manner, when the carbon implantation layer 110C is formed, the ions are implanted more shallowly than the ions implanted for forming the P-type channel implantation layer 103C.

Figure 9D:
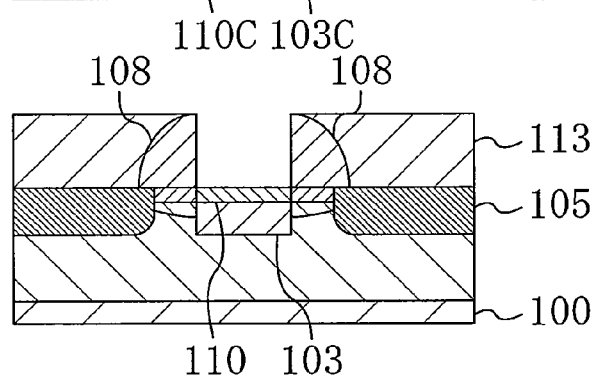

Next, as shown in FIG. 9D, a fourth rapid thermal annealing process is performed in which the semiconductor substrate 100 is heated to a temperature between about 850° C. and about 1050° C. at a heating rate of about 100° C./second or more, preferably, at about 200° C./second, and then the peak temperature is either maintained for about ten seconds at longest, or not maintained. As a result of the fourth rapid thermal annealing process, a P-type channel doped layer 103 is formed in the upper portion of the channel formation region in the semiconductor substrate 100 by the diffusion of the ions in the P-type channel implantation layer 103C. In the channel formation region, a carbon-containing region 110 is also formed shallowly in the upper portion of the P-type channel doped layer 103, from the carbon implantation layer 110C.

Figure 9E:
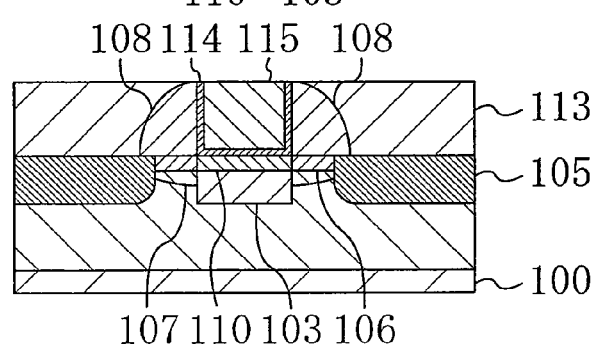

Then, as shown in FIG. 9E, a gate insulating film 114 made of silicon oxide and having a thickness of from about 1.0 to about 2.0 nm, preferably having a thickness of 1.5 nm, is formed on the entire surfaces of the interlayer dielectric films 113 as well as on the opening 113a by a CVD process, and then a metal film for forming a gate electrode is formed on the gate insulating film 114 by a CVD process. The metal film is made of tungsten and has a thickness of about 150 nm. Thereafter, the unnecessary portion of the metal film on the interlayer dielectric films 113 is polished for removal by a CMP process, whereby the gate insulating film 114 is formed on the bottom and inner faces of the opening 113a and a gate electrode 115 made of the metal film is formed inwardly of the gate insulating film 114. In this embodiment, although a silicon oxide film is used as the gate insulating film 114, a SiON film or a high dielectric film (a high-k film) made of, e.g., hafnium oxide (Hf$_x$) or hafnium silicate (HfSiO$_x$) may alternatively be used.

As described above, according to the third embodiment, in the steps shown in FIGS. 9C and 9D, indium ions are implanted into the channel formation region in the semiconductor substrate 100 exposed in the opening 113a formed between the interlayer dielectric films 113, thereby forming the P-type channel implantation layer 103C, and thereafter, carbon ions are selectively implanted into the upper portion of the P-type channel implantation layer 103C to form the carbon implantation layer 110C. Then, the activation annealing (the fourth rapid thermal annealing) for activating the indium ions contained in the P-type channel implantation layer 103C is performed.

In this manner, in the third embodiment, the carbon ions are implanted into the channel formation region and then the activation annealing for activating the indium ions contained in the P-type channel implantation layer 103C is performed, whereby the activation of the indium ions is increased even in the fabrication method in which the dummy gate electrode is replaced with the metal gate electrode. Therefore, it is possible to overcome the decrease in the activation rate of the indium ions caused when the indium ions are used for the P-type channel doped layer 103. In addition, since the carbon ions are selectively implanted into the channel formation region, the carbon is not contained in regions in the semiconductor device where no carbon is necessary, thereby preventing the semiconductor device from being contaminated by the carbon and suppressing junction leakage due to the residual carbon.

Accordingly, it is possible to reliably form the P-type channel doped layer 103 in which a steep shallow junction, a feature of a P-type doped layer formed by indium-ion implantation, is obtained, while a low resistance is achieved by the increased activation of the indium ions.

Fourth Embodiment

Hereinafter, a fourth embodiment of the present invention will be described with reference to the accompanying figures.

Figure 10:
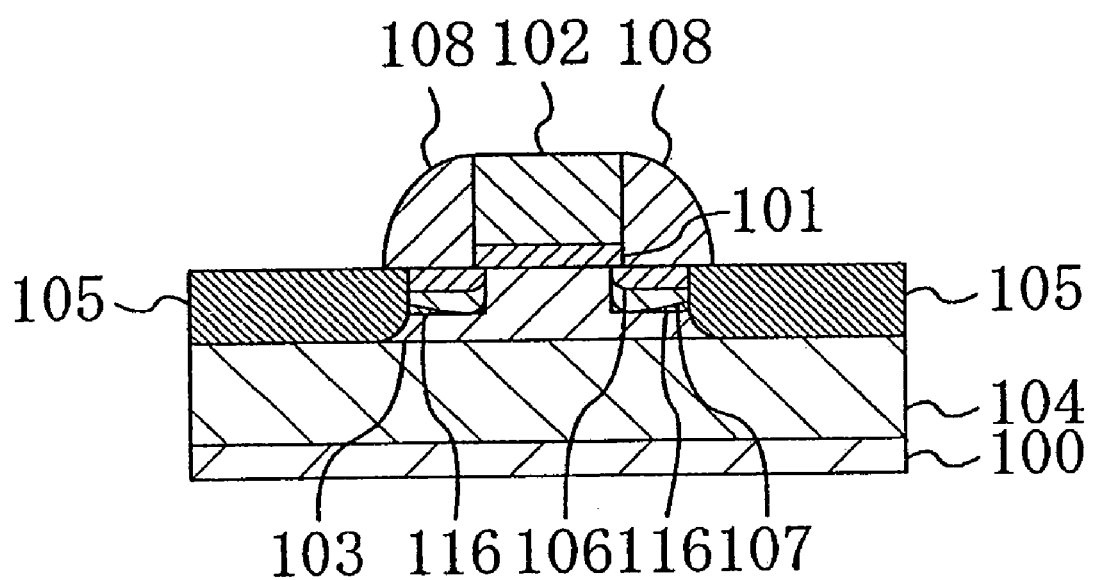
FIG. 10 illustrates a cross sectional structure of a semiconductor device according to a fourth embodiment of the present invention.

FIG. 10 illustrates a cross sectional structure of a semiconductor device, a MIS transistor, according to the fourth embodiment of the present invention. In FIG. 10, the same members as those of FIG. 1 are identified by the same reference numerals and the description thereof will be omitted herein.

As shown in FIG. 10, in the MIS transistor of the fourth embodiment, N-type extended doped layers 106 and P-type pocket doped layers 107 located in a semiconductor substrate 100 beneath sidewalls 108 are provided in carbon-containing regions 116.

Hereinafter, with reference to the accompanying figures, it will be described how to fabricate a semiconductor device having the above structure.

FIGS. 11A through 11D and FIGS. 12A through 12D are cross-sectional views indicating process steps for fabricating a semiconductor device according to the fourth embodiment of the present invention.

Figure 11A:
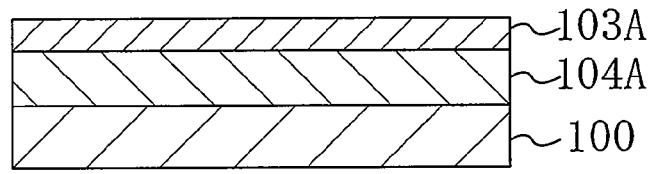
FIGS. 11A through 11D are cross-sectional views indicating process steps for fabricating the semiconductor device of the fourth embodiment of the present invention.

First, as shown in FIG. 11A, ions of indium (In) as a P-type dopant are implanted into a P-type silicon semiconductor substrate 100 at an implantation energy of about 70 keV and at an implantation dose of about $5\times10^{12}$ ions/cm$^2$, thereby forming a P-type channel implantation layer 103A in the upper portion of the semiconductor substrate 100. Subsequently, ions of boron (B) as a P-type dopant are implanted shallowly into the semiconductor substrate 100 under first implantation conditions, i.e., at an implantation energy of about 80 keV and at an implantation dose of about $1\times10^{13}$ ions/cm$^2$, and then boron ions are implanted deeply under second implantation conditions, i.e., at an implantation energy of about 200 keV and at an implantation dose of about $1\times10^{13}$ ions/cm$^2$, thereby forming a P-type well implantation layer 104A in the semiconductor substrate 100 under the P-type channel implantation layer 103A. In this manner, when the P-type well implantation layer 104A is formed, the ions are implanted more deeply than the ions implanted for forming the P-type channel implantation layer 103A.

Figure 11B:
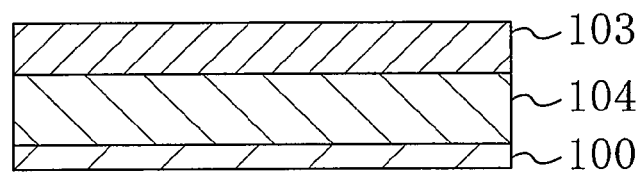

Next, as shown in FIG. 11B, a first rapid thermal annealing (RTA) process is performed in which the semiconductor substrate 100 with the P-type channel implantation layer 103A and the P-type well implantation layer 104A formed therein is heated to a temperature between about 850° C. and about 1050° C. at a heating rate of about 100° C./second or more, preferably, at about 200° C./second, and then the peak temperature is either maintained for about ten seconds at longest, or not maintained. As a result of the first rapid thermal annealing process, a P-type channel doped layer 103 and a P-type well 104 are formed in the upper portion of the semiconductor substrate 100 by the diffusion of the indium ions in the P-type channel implantation layer 103A and by the diffusion of the boron ions in the P-type well implantation layer 104A, respectively. The P-type well 104 has a deeper diffusion depth than the P-type channel doped layer 103 and is formed under and in contact with the P-type channel doped layer 103.

Figure 11C:
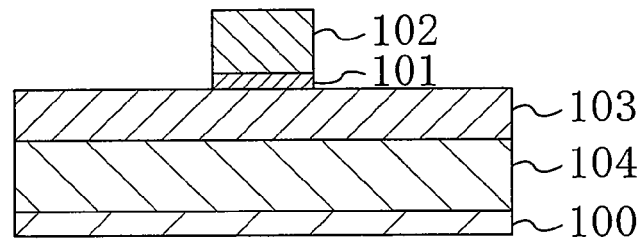

Then, as shown in FIG. 11C, a gate insulating film 101 made of silicon oxide and having a thickness of about 1.5 nm is formed on the principal surface of the semiconductor substrate 100 by a thermal oxidation process, for example. Subsequently, a gate electrode 102 made of polysilicon and having a thickness of about 150 nm is formed on the gate insulating film 101 by a CVD process.

Figure 11D:
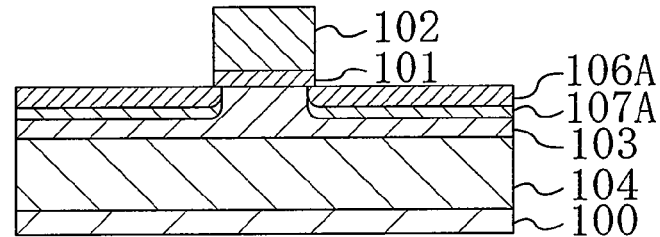

Then, as shown in FIG. 11D, with the gate electrode 102 used as a mask, ions of arsenic (As) as an N-type dopant are implanted into the semiconductor substrate 100 at an implantation energy of about 1 keV and at an implantation dose of about $2\times10^{14}$ ions/cm$^2$, thereby forming N-type extended implantation layers 106A in the semiconductor substrate 100 to both sides of the gate electrode 102. In this ion implantation process, with the gate electrode 102 used as a mask, ions of indium (In) as a P-type dopant are preferably implanted into the semiconductor substrate 100 at an implantation energy of about 100 keV and at an implantation dose of about $4\times10^{13}$ ions/cm$^2$ to form P-type pocket implantation layers 107A under the N-type extended implantation layers 106A. In this process, when the P-type pocket implantation layers 107A are formed, the ions are implanted more deeply than the ions implanted for forming the N-type extended implantation layers 106A.

Figure 12A:
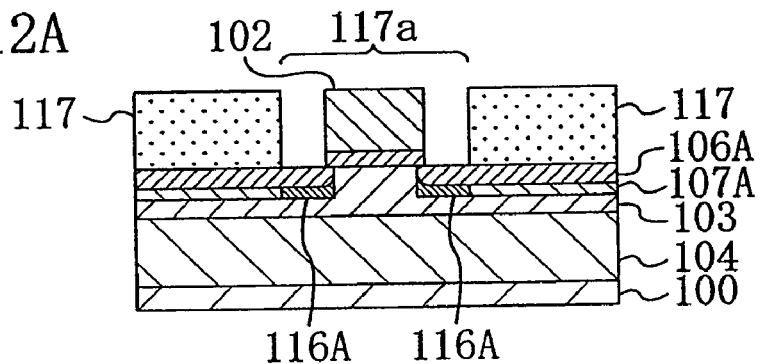
FIGS. 12A through 12D are cross-sectional views indicating process steps for fabricating the semiconductor device of the fourth embodiment of the present invention.

Next, as shown in FIG. 12A, a resist pattern 117 is formed by a lithography process on the semiconductor substrate 100. The resist pattern 117 has openings 117a for exposing the gate electrode 102 of the MIS transistor and sidewall formation regions located at both sides of the gate electrode 102. In this way, the resist pattern 117 preferably covers the heavily-doped source/drain formation regions of the MIS transistor and has the openings that correspond to the sidewall formation regions thereof. Thereafter, with the resist pattern 117 and the gate electrode 102 used as a mask, carbon ions are implanted into pocket formation regions in the semiconductor substrate 100 at an implantation energy of about 40 keV and at an implantation dose of about $5\times10^{14}$ ions/cm$^2$ to a depth equal to or deeper than the implantation depth of the P-type pocket implantation layers 107A, thereby forming carbon implantation layers 116A.

Figure 12B:
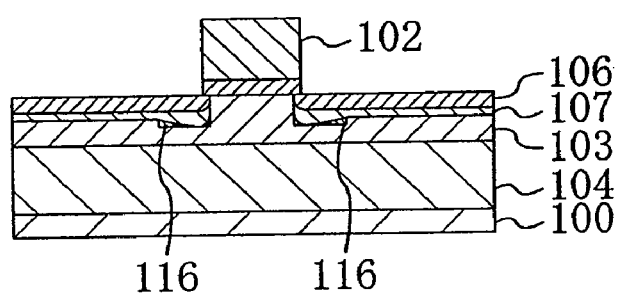

Next, as shown in FIG. 12B, the resist pattern 117 is removed by ashing or the like. Thereafter, a second rapid thermal annealing process is performed in which the semiconductor substrate 100 is heated to a temperature between about 850° C. and about 1050° C. at a heating rate of about 200° C./second and then the peak temperature is either maintained for about ten seconds at longest, or not maintained. As a result of the second rapid thermal annealing process, N-type extended doped layers 106 having a relatively shallow junction are formed in the semiconductor substrate 100 to both sides of the gate electrode 102 by the diffusion of the arsenic ions contained in the N-type extended implantation layers 106A. At the same time, under the N-type extended doped layers 106, P-type pocket doped layers 107 are formed in contact with the lower portions of the N-type extended doped layers 106 by the diffusion of the indium ions contained in the P-type pocket implantation layers 107A. In addition, carbon-containing regions 116 are formed in the semiconductor substrate 100 beneath the sidewall formation regions located at both sides of the gate electrode 102, by the diffusion of the nitrogen ions contained in the carbon implantation layers 116A. The carbon-containing regions 116 have a diffusion depth equal to or deeper than that of the P-type pocket doped layers 107.

Figure 12C:
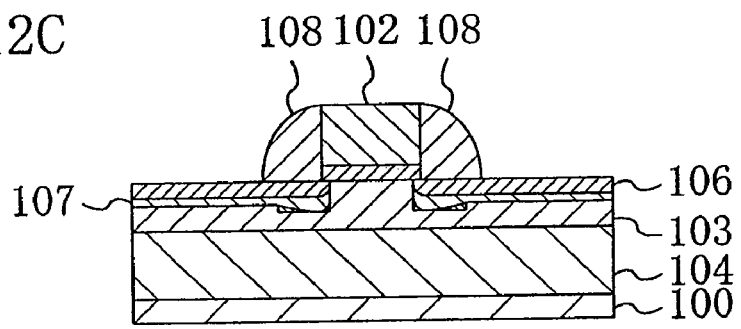

Next, as shown in FIG. 12C, a silicon nitride film having a thickness of about 50 nm is deposited on the entire surface of the semiconductor substrate 100 as well as on the gate electrode 102 by a CVD process, for example. The deposited silicon nitride film is then etched anisotropically, thereby forming sidewalls 108 made of the silicon nitride film on both lateral faces of the gate electrode 102 along the gate-length direction.

Figure 12D:
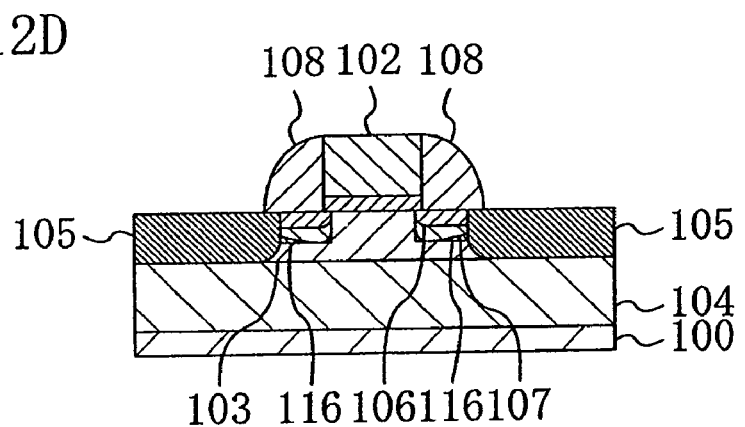
Figure 13A:
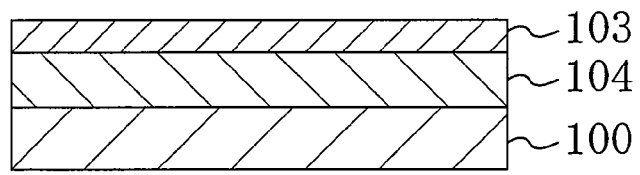
FIGS. 13A through 13E are cross-sectional views indicating process steps for fabricating a semiconductor device including a conventional MIS transistor.
Figure 13B:
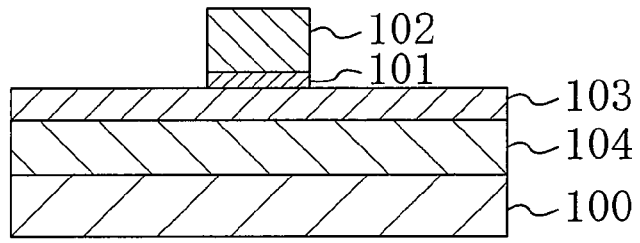
Figure 13C:
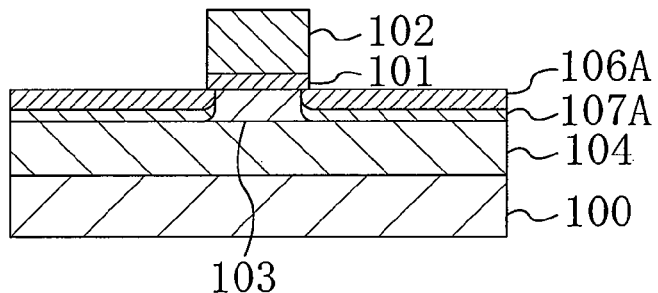
Figure 13D:
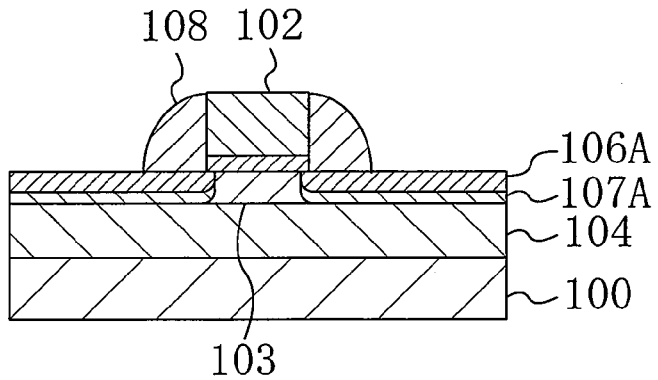
Figure 13E:
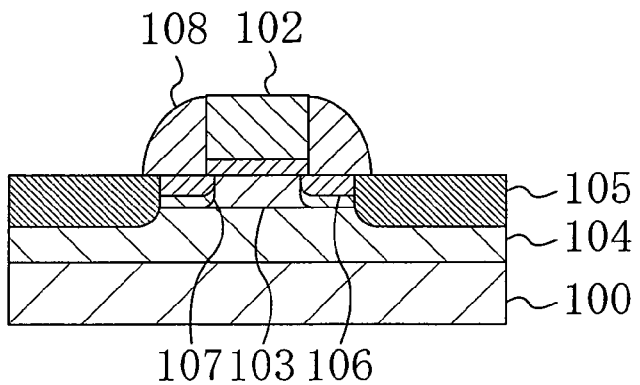

Next, as shown in FIG. 12D, the gate electrode 102 and the sidewalls 108 used as a mask, ions of arsenic as an N-type dopant are implanted into the semiconductor substrate 100 at an implantation energy of about 10 keV and at an implantation dose of about $3\times10^{15}$ ions/cm$^2$. Subsequently, a third rapid thermal annealing process is performed in which the semiconductor substrate 100 is heated to a temperature between about 850° C. and about 1050° C. at a heating rate between about 200° C./second and about 250° C./second and then the peak temperature is either maintained for about ten seconds at longest, or not maintained. As a result of the third rapid thermal annealing process, N-type heavily doped source/drain layers 105 are formed in the semiconductor substrate 100 alongside the respective sidewalls 108 by the diffusion of the arsenic ions. The N-type heavily doped source/drain layers 105 are connected with the N-type extended doped layers 106 and have a deeper junction than the N-type extended doped layers 106.

As described above, according to the fourth embodiment, in the steps shown in FIGS. 12A and 12B, indium ions are selectively implanted into the pocket formation regions in the semiconductor substrate 100 to form the P-type pocket implantation layers 107A, and thereafter, carbon ions are selectively implanted into the P-type pocket implantation layers 107A to form the carbon implantation layers 116A. Then, the activation annealing (the second rapid thermal annealing) for activating the indium ions contained in the P-type pocket implantation layers 107A is performed.

In this manner, in the fourth embodiment, the carbon ions are implanted into the pocket formation regions and then the activation annealing for activating the indium ions contained in the P-type pocket implantation layers 107A is performed, whereby the activation of the indium ions is increased. Therefore, it is possible to overcome the decrease in the activation rate of the indium ions caused when the indium ions are used for the P-type pocket doped layers 107. In addition, since the carbon atoms are selectively implanted into the pocket formation regions, the carbon is not contained in regions in the semiconductor device where no carbon is necessary, thereby preventing the semiconductor device from being contaminated by the carbon and suppressing junction leakage due to the residual carbon.

Accordingly, it is possible to reliably form the P-type pocket doped layers 107 in which a steep shallow junction, a feature of a P-type doped layer formed by indium-ion implantation, is obtained, while a low resistance is achieved by the increased activation of the indium ions.

In the first through fourth embodiments of the present invention, indium ions are used as the dopant ions for the P-type channel doped layer 103. However, instead of the indium ions, ions of boron or ions of an element that is heavier than boron and makes the channel doped layer 103 P-type may be used, or boron ions and ions of such an element may both be used.

Similarly, in each of the foregoing embodiments, indium ions are used as the dopant ions for the P-type pocket doped layers 107. However, instead of the indium ions, ions of boron or ions of an element that is heavier than boron and makes the pocket doped layers 107 P-type may be used, or boron ions and ions of such an element may both be is used.

Furthermore, in each embodiment, an N-channel MIS transistor is used as the semiconductor device. Instead of this, however, a P-channel MIS transistor may be used. In the case of using a p-channel MIS transistor, arsenic (As) ions or ions of a Group VB element heavier than arsenic, such as antimony (Sb) ions or bismuth (Bi) ions, for example, may be used as the N-type dopant ions for forming the channel doped layer.

Also, in each embodiment, the carbon implantation layer is formed by implanting ions of carbon. However, carbon may be introduced by changing methane gas or the like to plasma and then by the plasma damage due to the carbon contained in the methane gas in the form of plasma. Also, heavily doped source/drain layers made of strained silicon layers may be formed alongside the sidewalls.

Moreover, in each embodiment, the carbon ions implanted are not limited to carbon atoms, but ions of carbon molecules that contain carbon (for example, $CO_2$) may also be used.

In the structures described in the foregoing embodiments, carbon is added to the channel doped layer or the pocket doped layers. However, in cases in which heavy ions such as indium ions are used for the extended doped layers, carbon may be likewise added to the extended doped layers. Then, during a heat treatment for forming the extended doped layers, the carbon suppresses transient enhanced diffusion of a dopant, while increasing the activation of the dopant. Therefore, the extended doped layers are allowed to have steep dopant profiles having a shallow junction, which is necessary to reduce the device size, while the activation concentration is increased sufficiently, thereby realizing the extended doped layers having a low resistance. As a result, a miniaturized device capable of maintaining a large driving force is realized.

As described above, the semiconductor devices and their fabrication methods according to the present invention allow the channel doped layer or the pocket doped layers to have steep dopant profiles having a shallow junction, which are necessary to reduce the device size, while permitting the activation concentration to be increased sufficiently, thereby realizing a miniaturized device capable of maintaining a large driving force. Therefore, the inventive semiconductor devices and their fabrication methods are particularly applicable, e.g., to MIS semiconductor devices which can be miniaturized and have a low-resistance doped-layer having a shallow junction depth, and to their fabrication methods.

What is claimed is:

1. A semiconductor device comprising:
a gate insulating film formed on a semiconductor region of a first conductivity type;
a gate electrode formed on the gate insulating film;
extended doped layers of a second conductivity type formed in the semiconductor region under sides of the gate electrode;
pocket doped layers of the first conductivity type formed in the semiconductor region under and in contact with the extended doped layers;
sidewalls formed on lateral faces of the gate electrode; and
source/drain doped layers of the second conductivity type formed in the semiconductor region alongside the respective sidewalls, wherein:
the extended doped layers and the pocket doped layers are provided in an inside of a carbon-containing region on both sides of the gate electrode, and
ions of carbon are doped in regions directly under only the sidewalls and side portions of the gate electrode.

2. The device of claim 1, wherein
the carbon-containing regions have a diffusion depth equal to or deeper than the pocket doped layers.

3. The device of claim 1, wherein
dopant ions introduced into the pocket doped layers are heavy ions having a relatively high mass number.

4. The device of claim 3, wherein the heavy ions are indium ions.

5. The device of claim 1, wherein
dopant ions introduced into the pocket doped layers are both of ions of boron and ions of an element that is heavier than boron and makes the pocket doped layers P conductivity type.

6. The device of claim 1, further comprising
a channel doped layer of the first conductivity type formed in the semiconductor region under the gate electrode.

7. The device of claim 6, wherein
dopant ions introduced into the channel doped layer are both of ions of boron and ions of an element that is heavier than boron and makes the channel doped layer P conductivity type.

8. The device of claim 1, wherein the semiconductor region is made of silicon.

* * * * *